United States Patent
Kim et al.

(10) Patent No.: US 7,205,543 B2
(45) Date of Patent: Apr. 17, 2007

(54) AUTO FOCUSING APPARATUS AND METHOD

(75) Inventors: Yong-Wan Kim, Yongin-si (KR); Sang-Kil Lee, Gyeonggi-do (KR); Byung-Am Lee, Gyeonggi-do (KR); Jin-Woo Lee, Sungnam-si (KR); Hyo-Sang Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 23 days.

(21) Appl. No.: 10/959,174

(22) Filed: Oct. 7, 2004

(65) Prior Publication Data

US 2005/0127293 A1    Jun. 16, 2005

(30) Foreign Application Priority Data

Dec. 12, 2003  (KR) ............... 10-2003-0090640

(51) Int. Cl.
    *G01N 23/00*  (2006.01)
(52) U.S. Cl. ................... 250/311; 250/201.3
(58) Field of Classification Search ........... 359/698, 359/823, 689
    See application file for complete search history.

(56) References Cited

U.S. PATENT DOCUMENTS

| | | | |
|---|---|---|---|
| 5,034,768 A | 7/1991 | Miyadera | |
| 5,144,492 A * | 9/1992 | Iijima et al. | 359/698 |
| 5,300,786 A * | 4/1994 | Brunner et al. | 250/548 |
| 5,747,202 A | 5/1998 | Tanaka | |
| 6,066,419 A | 5/2000 | Wu et al. | |
| 6,608,920 B1 | 8/2003 | Su et al. | |
| 7,015,445 B2 * | 3/2006 | Bishop | 250/201.4 |
| 2003/0158710 A1 | 8/2003 | Bowley, Jr. et al. | |

FOREIGN PATENT DOCUMENTS

| | | |
|---|---|---|
| DE | 40 06 601 A1 | 9/1990 |
| JP | 2001-082926 | 3/2001 |
| JP | 2002-190439 | 7/2002 |
| KR | 10-1999-0066049 | 12/1999 |
| KR | 2000-0005892 | 4/2000 |

OTHER PUBLICATIONS

Korean Patent Office Action dated Jul. 28, 2005 (with English Translation) for KR Application No. 10-2003-0090640.
English translation of German Office Action dated Jul. 12, 2006 for corresponding German Application No. 10 2004 059 664.6-51.

* cited by examiner

*Primary Examiner*—Nikita Wells
*Assistant Examiner*—James J. Leybourne
(74) *Attorney, Agent, or Firm*—Harness, Dickey & Pierce, P.L.C.

(57) ABSTRACT

An auto focusing method and apparatus for determining a focusing evaluation value, comparing the focusing evaluation value with an acceptance level of a preset focusing evaluation value, and iteratively focusing, while widening the depth of focus, when the focusing evaluation value is lower than the acceptance level.

28 Claims, 5 Drawing Sheets

AUTO FOCUSING APPARATUS AND METHOD

PRIORITY STATEMENT

This application claims priority of Korean Patent Application No. 2003-90640, filed on Dec. 12, 2003 in the Korean Intellectual Property Office, the disclosure of which is incorporated herein in its entirety by reference.

BACKGROUND OF THE INVENTION

1. Field the Invention

The present invention relates to an auto focusing apparatus and method. More specifically, the present invention is directed to an auto focusing apparatus and method for automatically adjusting a focus when linewidth of a pattern formed on a semiconductor wafer is measured.

2. Description of Related Art

Most semiconductor devices may be manufactured by forming desired patterns, which may be formed by iteratively performing multiple processes such as formation of various thin films on a wafer surface, exposure using a given mask, and selective etching.

A critical dimension (CD) and a profile of a pattern copied on a wafer surface may vary with focus magnitude of an exposure system.

The shorter an exposure wavelength may be, the greater the variation of the CD and/or the profile. Therefore, monitoring of the focusing process may be significant in a semiconductor manufacturing industry. As a result, a typical exposing system used in semiconductor manufacturing may have an auto focusing apparatus to achieve improved or optimal focusing.

If a thin film is selectively etched to form a pattern on a wafer surface, a worker may start to check whether a pattern forming process is being performed correctly according to a given design. The worker may check whether the pattern formed on the wafer surface is correctly aligned with a previously formed circuit pattern and/or whether linewidth of a pattern copied on a wafer surface is of a desired size.

The most general method for measuring optimal focusing may be after a specific-shaped pattern is formed on a wafer, variation of a critical dimension and/or a profile of the pattern may be checked by alternating the focus. However, the variation may be determined by a worker's naked eye using a scanning electron microscope (SEM). As a result, the reliability of the determination may be dependent up differences between individuals and/or skill of the worker.

Another auto focusing method has been proposed, where a magnitude of a defocus may be computed using a phase shift mask and a pattern is shifted along a focus.

Apart from the above, there are other proposals, in which auto focusing of an objective lens is described with relation to a measurement of a pattern linewidth.

As integration density of semiconductor devices increases and/or a tolerance is reduced, a linewidth measuring value may be varied according to the skill of a worker and/or a reliability for auto measurement. Thus, auto focusing and linewidth measurement may be the current trend for improving reliability and/or accuracy of alignment.

In recent years, there has been an increasing requirement for monitoring defects to determine whether the defects may be a pattern profile linewidth size abnormality or a linewidth size abnormality caused by poor auto focusing. Particularly, defects resulting from poor auto focusing may increase resulting in interlock, occurrences of abnormalities, etc.

However, a conventional linewidth measuring apparatus may not have a method or system for detecting erroneous auto focusing and/or problems caused by erroneous auto focusing. Thus, the conventional linewidth measuring apparatus may mistakenly measure a pattern having a desire-sized linewidth as an erroneous pattern due to a poor focusing. In particular, mistakenly measuring a normal pattern as an erroneous pattern may have an effect on a photolithographic process which may lead to yield reductions. Further, when interlock and/or other problems occur because erroneous data is measured by poor focusing, additional time may be required for analyzing and/or checking a measured value which may result in production delays.

SUMMARY OF THE INVENTION

Exemplary embodiments of the present invention provide an auto focusing apparatus and a method for reducing and/or preventing erroneous focusing.

Exemplary embodiments of the present invention provide an auto focusing apparatus and a method for real-time monitoring of auto focusing occurring in a fabrication facility (FAB).

In exemplary embodiments of the present invention, a focusing evaluation value may be obtained and/or quantified (or determined). If the quantified (or determined) focusing evaluation value is less than an acceptance level, focusing may be iteratively performed while widening the depth of focus (DOF).

In an exemplary embodiment, an auto focusing method may include quantifying (or determining) a focusing evaluation value, comparing the focusing evaluation value with an acceptance level of a preset focusing evaluation value, and iteratively focusing, while widening the depth of focus, when the focusing evaluation value is lower than the acceptance level.

In an exemplary embodiment, an auto focusing method may include focusing a specific point of a wafer, quantifying (or determining) a focusing evaluation value of the focusing and comparing the focusing evaluation value with an acceptance level of a preset focusing evaluation value, determining the focusing to be "GOOD" when the focusing evaluation value is higher than the acceptance level, and iteratively focusing the specific point, while widening a depth of focus, when the focusing evaluation value is lower than the acceptance level.

In another exemplary embodiment, an auto focusing method may include performing alignment focusing for an alignment point of a wafer, quantifying (or determining) an evaluation of the alignment focusing and comparing an alignment focusing evaluation value of the alignment focusing with an acceptance level of a preset alignment focusing evaluation value, performing measurement focusing for a measurement point of the wafer when the alignment focusing evaluation value is higher than the acceptance level, an iteratively performing an alignment focusing for the alignment point, while widening a depth of focus, when the alignment focusing evaluation value is lower than the acceptance level.

In exemplary embodiments of the present invention, iteratively focusing the specific point may include quantifying (or determining) the focusing evaluation value and comparing the quantified (or determined) focusing evaluation value with the acceptance level, if the focusing evaluation value is higher than the acceptance level, the focusing may be determined to be "GOOD", and if the focusing evaluation value is lower than the acceptance level, iteratively focusing the specific point while widening the DOF by means of the predetermined apparatus.

In another exemplary embodiment, an auto focusing method may include performing first alignment focusing for an alignment point of the wafer, quantifying (or determining) an evaluation value of the first alignment focusing and comparing an alignment focusing evaluation value of the first alignment focusing with an acceptance level of a preset first focusing evaluation value, performing first measurement focusing for a measurement point of the wafer when the first alignment focusing evaluation value is higher than the acceptance level, and performing second alignment focusing for the alignment point of the wafer with a wider depth of focus than the depth of focus of the first alignment focusing when the first alignment focusing evaluation value is lower than the acceptance value.

In another exemplary embodiment, an auto focusing apparatus may include a focusing part including a scanning electron microscope (SEM) for focusing an alignment point and a measurement point of a wafer, a control part including a detector for detecting second electrons from the SEM, an analog-to-digital converter (A/D converter) for converting an analog signal to a digital signal, and a controller for comparing an evaluation value of the focusing with an acceptance level of a preset focusing evaluation value and iteratively focusing if the evaluation value of the focusing is lower than the acceptance level, an input part for receiving information from the controller, the controller receiving an output of the input part, and a display part for visually displaying an operation of the controller.

According to exemplary embodiments of the present invention, a specific point of a wafer may be focused. A focusing evaluation value may be quantified (or determined) and the quantified (or determined) focusing evaluation value may be compared with a limit value. If the focusing evaluation value is lower than an acceptance level, a current value of an objective lens may be regulated to iteratively perform a focusing while gradually widening a DOF. Thus, various errors may be reduced.

BRIEF DESCRIPTION OF THE DRAWINGS

The present invention will become readily apparent from the description of the exemplary embodiments that follows, with reference to the attached drawings in which.

DETAILED DESCRIPTION OF EXEMPLARY EMBODIMENTS OF THE INVENTION

Figure 1:
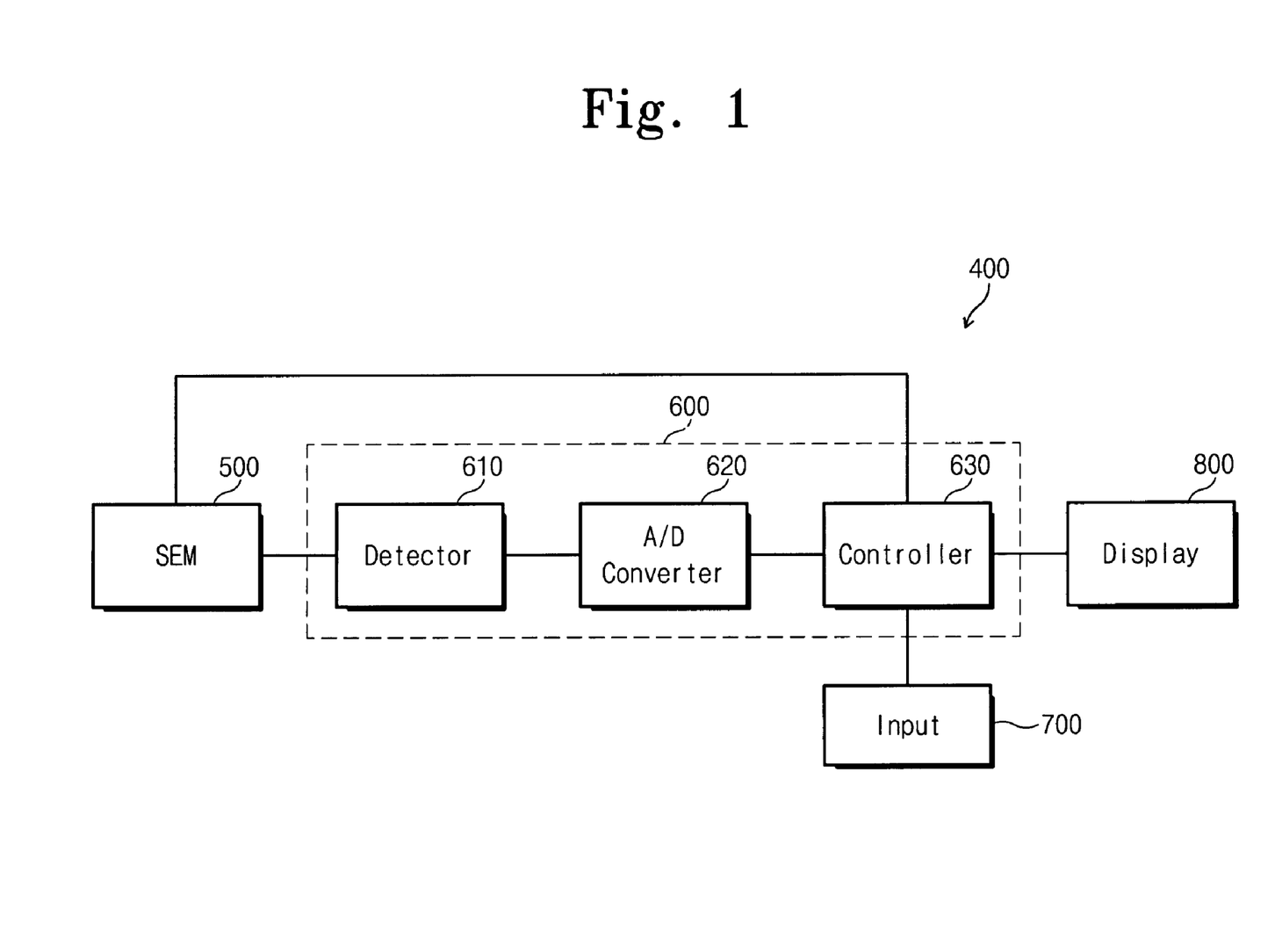
FIG. 1 is an illustration configuration diagram of an auto focusing apparatus according to an exemplary embodiment of the present invention.

An auto focusing apparatus according to exemplary embodiments of the present invention is schematically illustrated in FIG. 1. Referring to FIG. 1, the auto focusing apparatus 400 may include a focusing part 500, which may further include a scanning electron microscope (SEM), which may be used for performing a focusing operation, a control part 600 for controlling an operation of the focusing part 500, an input part 700 for inputting information, and a display 800 for visually displaying a control operation of the control part 600.

The control part 600 may include a detector 610 for detecting secondary electrons from the SEM of the focusing part 500, an A/D converter 620 for converting an analog signal to a digital signal, a controller 630 for comparing an acceptance level of a preset focusing evaluation value with a focusing evaluation value and controlling the focusing part 500 to iteratively perform a focusing if the focusing evaluation value is less than the acceptance value. The acceptance level will be explained in detail below.

The control part 600 may control an auto focusing method.

Figure 2:
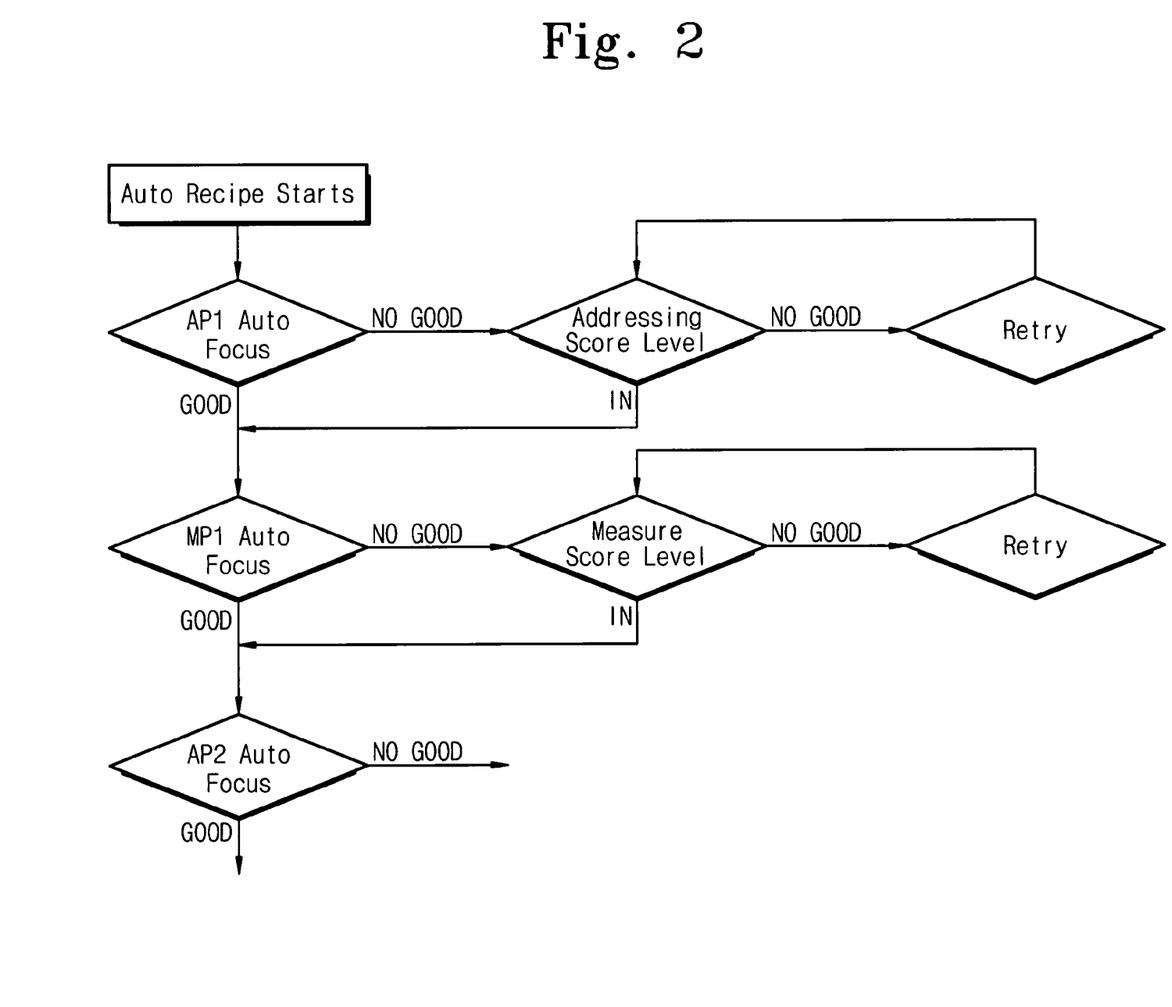
FIG. 2 is a flowchart illustrating an auto focusing method according to an exemplary embodiment of the present invention.
Figure 3:
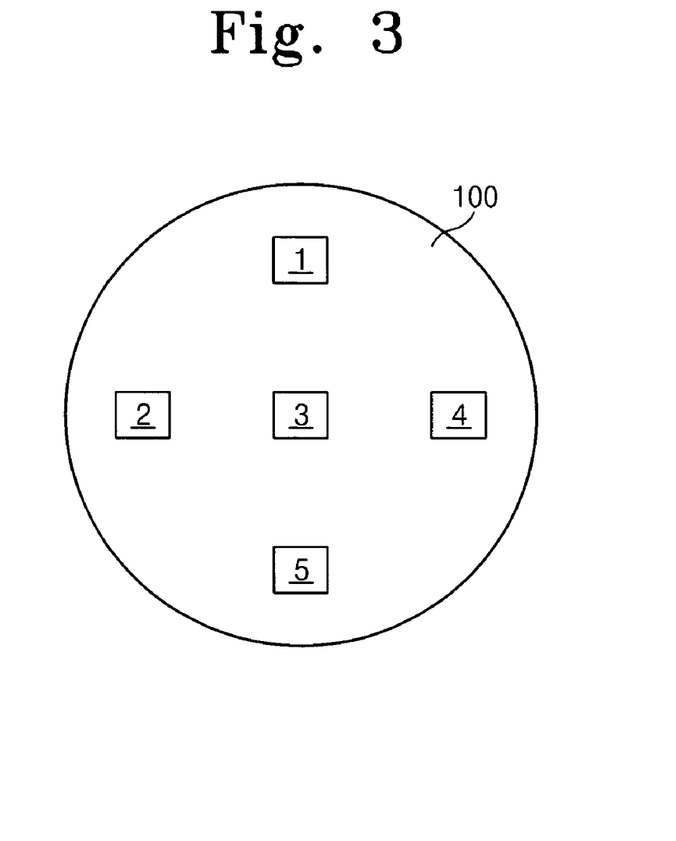
FIG. 3 is an illustration of a view of a top plain of a wafer.

As shown in FIG. 2, an alignment point (AP1) of a wafer may be addressed to focus to, for example, about ten magnifications (first alignment focusing; AP1 auto focus). For example, a wafer 100 is divided into top 1, left 2, center 3, right 4, and bottom 5, as shown in FIG. 3 (although these divisions are only examples). The top 1, the left 2, the center 3, the right 4, and the bottom 5 each may be focused. In this invention, "to focus" may mean an alignment focusing to search a to-be-focused point (an alignment point) and/or a measuring focusing used to measure a linewidth of a pattern of a formed at a searched point (a measuring point).

Figure 4:
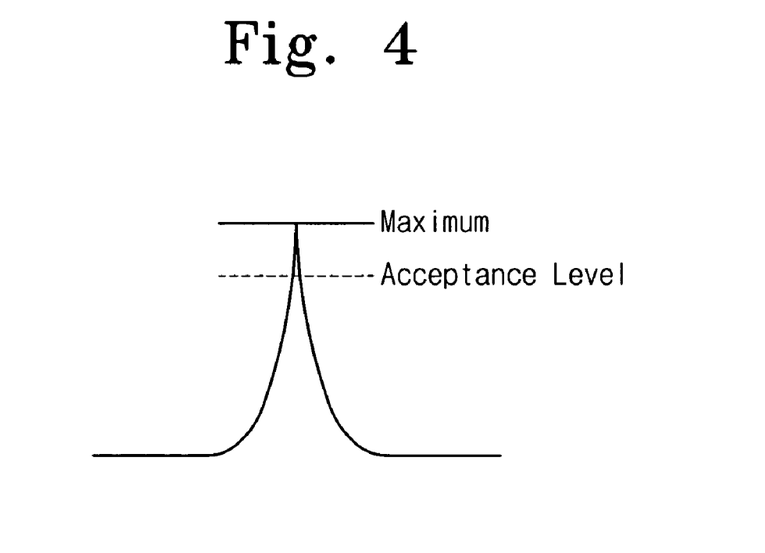
FIG. 4 is a graph illustrating an acceptance level in the auto focusing method according to an exemplary embodiment of the present invention.

The first alignment focusing evaluation value measured by the first alignment focusing for the top 1 of the wafer 100 may be quantified (or determined). The quantified (or determined) first alignment focusing evaluation value may be compared with the acceptance level of the preset alignment focusing evaluation value and a result of the comparison is determined (addressing score level). As shown in FIG. 4, the acceptance level may be less than (for example, 80 percent) of the maximum of the preset alignment focusing evaluation value so as to obtain reliable focusing.

If the first alignment focusing evaluation value is higher than the acceptance level, the first alignment focusing may be determined to be "GOOD". If the first alignment focusing is determined as "GOOD", a measurement point 1 (MP1) may be focused to measure a linewidth (MP1 auto focus).

If the first alignment focusing evaluation value is lower than the acceptance level, the first alignment focusing may be determined to be "NO GOOD". If the first alignment focusing is determined as "NO GOOD", a retry may be performed, i.e., the first alignment point of a wafer may be re-addressed to re-perform an alignment focusing (second alignment focusing). An evaluation value and an acceptance level of the second alignment focusing may be compared (addressing score level). In this case, the acceptance level may also be less than (for example, 80 percent) of the maximum of the preset alignment focusing evaluation value previously described.

If the evaluation value of the second alignment focusing is higher than the acceptance level, the second alignment focusing may be determined as "GOOD" to proceed to the first measurement focusing (MP1 auto focus). However, if the result of the second alignment focusing is lower than the acceptance level, the second alignment focusing may be determined as "NO GOOD" and another retry may be performed, i.e., re-address the first alignment point of the wafer. In this case, the acceptance level may also be less than (for example 80 percent) of the maximum of the preset alignment focusing evaluation value previously described.

Figure 5:
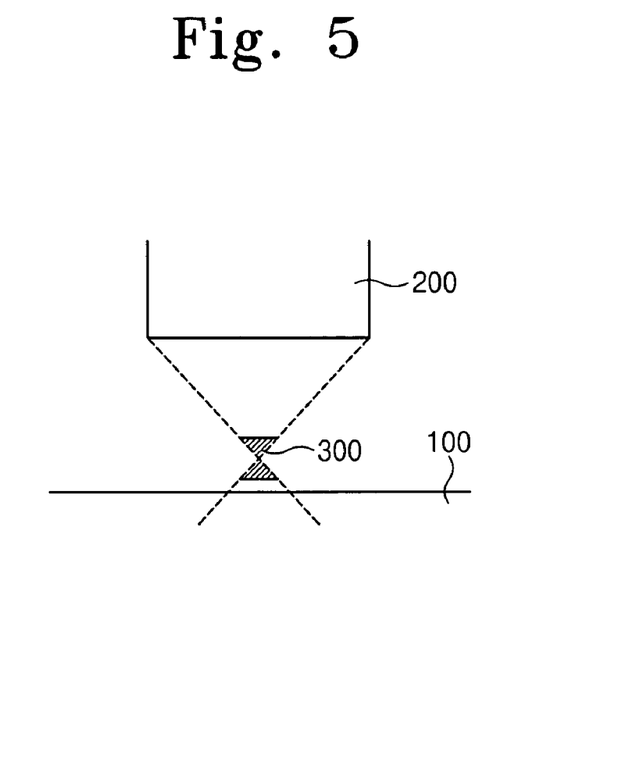
FIG. 5 through FIG. 7 illustrate cross-sectional views for an auto focusing method according to an exemplary embodiment of the present invention.
Figure 6:
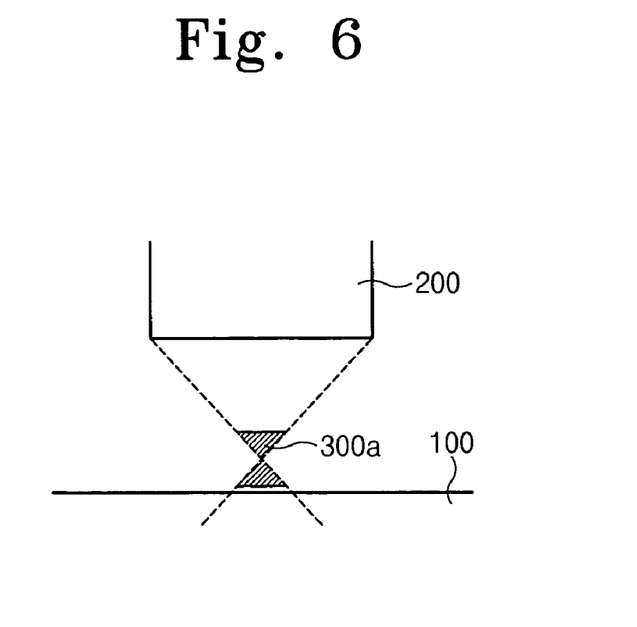
Figure 7:
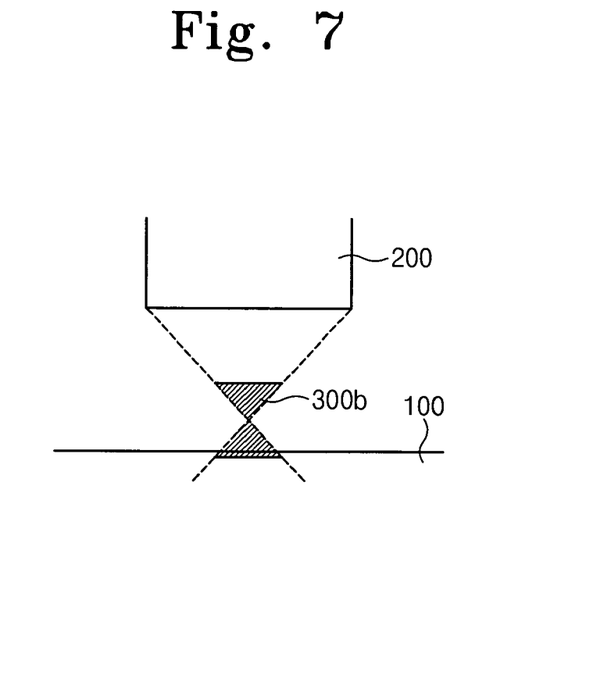
Figure 8:
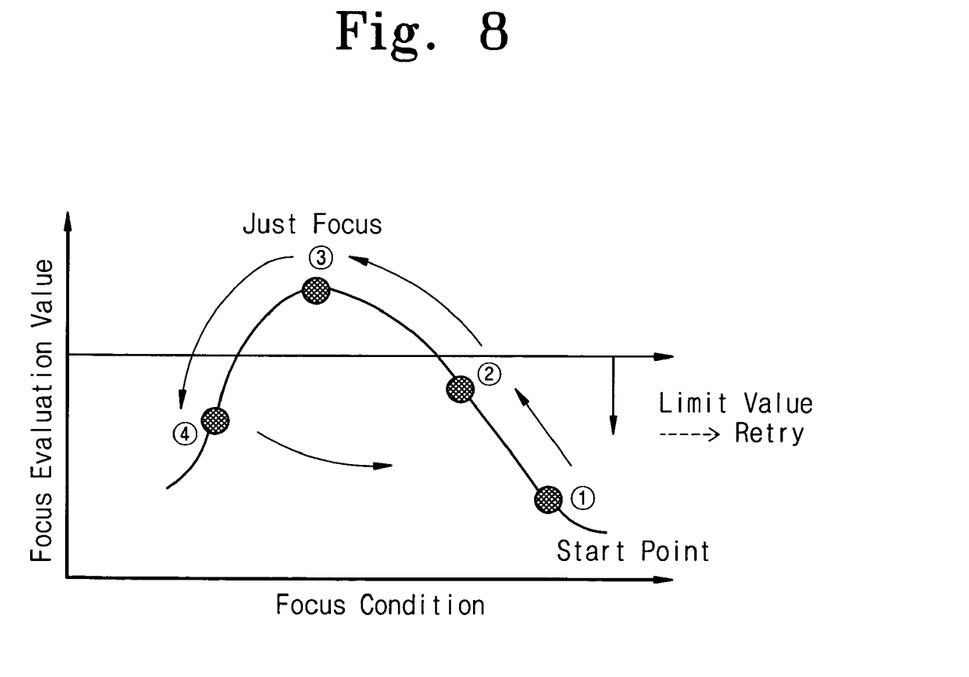
FIG. 8 is a graph for illustrating an auto focusing method in the auto focusing method according to an exemplary embodiment invention.

In the second alignment focusing, a current value of an objective lens 200 of the SEM may be regulated to use a depth of focus (DOF) wider than the DOF of the first alignment focusing, as shown in FIG. 5 through FIG. 7. Similarly, a DOF of a third (and subsequent) alignment focusing may be set to be wider than the DOF of the second (and previous) alignment focusing.

Specifically, in the case where the alignment point of the wafer 100 is subjected to the first alignment focusing by the objective lens 200 of the SEM, if a wafer is not within its DOF 300, the first alignment focusing may be determined to be "NO GOOD". If the first alignment focusing is determined to be "NO GOOD", a second alignment focusing may be used. The DOF 300a of the second alignment focusing may be set to be wider than that DOF 300 of the first alignment focusing. If the second alignment focusing is determined to be "NO GOOD", a third (and subsequent) alignment focusing may be used to start. The DOF 300b of the third (and subsequent) alignment focusing may be set to be wider than the DOF 300a of the second (and previous) alignment focusing.

To obtain more reliable alignment focusing, the DOFs 300a and 300b may be within a focus margin of the first alignment focusing. The alignment focusing may be repeated multiple times within a scope of the focus margin of the first alignment focusing, if a wafer pattern is not within the focus margin of the first alignment focusing. As a result, the pattern may be determined to be bad. The number of retries of the alignment focusing may be set at random inasmuch as the DOF of the alignment focusing in the respective degrees may be within the focus margin of the first alignment focusing.

Measurement focusing may be similar to the alignment focusing described above. That is, if the result of the first alignment focusing or retry is that the second or third alignment focusing evaluation values is higher than an acceptance level of the preset first alignment focusing, the method may proceed to the first measurement focusing (MP1 auto focus) for a measurement point of a wafer with a higher magnification than a magnification of the measurement focusing.

The first measurement focusing evaluation value may be quantified (or determined). The quantified (or determined) first measurement focusing evaluation value and the acceptance level of the preset first measurement focusing may be compared (measure score level). If the quantified (or determined) first measurement focusing evaluation value is higher than the acceptance level, the first measurement focusing may be determined to be "GOOD" and anther alignment point of the wafer may be addressed, e.g., the second point (left of the wafer) shown in FIG. 3. To obtain more reliable focusing, the acceptance level may be less than (for example, 80 percent) of the maximum of the preset alignment focusing evaluation value.

If the first measurement focusing evaluation value is lower than the acceptance level, the first measurement focusing may be determined to be "NO GOOD". When the first measurement focusing may be determined to be "NO GOOD", the second measurement focusing may be repeated for the first measurement point of the wafer. The second measurement focusing evaluation value may be quantified (or determined). The quantified (or determined) second measurement focusing evaluation value and the preset acceptance level may be compared. If the second measurement focusing evaluation value is higher than the acceptance level, the second measurement focusing may be determined to be "GOOD" and a second alignment focusing (for example, AP2 auto focus) may be performed.

If the second measurement focusing evaluation value is lower than the acceptance level, the second measurement focusing may be determined as "NO GOOD". A retry may be repeated before proceeding to the third measurement focusing.

Similar to the alignment focusing, in the measurement focusing, a current value of an objective lens, such as object lens 200, may be regulated in the second measurement focusing to use a wider DOF than the DOF of the first measurement focusing. A DOF of a third (and subsequent) measurement may be set to be wider than the DOF of the second (and previous) measurement focusing.

To obtain more reliable measurement focusing, the DOF of the second measurement focusing and the DOF of the third measurement focusing may be within the focus margin of the first measurement focusing. Although the measurement focusing may be repeated multiple times within the focus margin of the first measurement focusing, if a wafer pattern is not within the focus margin of the first measurement focusing, the wafer pattern may be determined to be "NO GOOD". The number of retry times of the alignment focusing may be set at random inasmuch as the DOF of the alignment focusing in the respective degrees may be within the focus margin of the first alignment focusing.

As described above, in the alignment focusing and/or the measurement focusing, a specific point of a wafer may be focused and a focusing evaluation value may be quantified (or determined). The quantified (or determined) evaluation value and a preset limit value may be compared. If the focusing evaluation value is lower than an acceptance value, a current value of an objective lens may be regulated to iteratively perform focusing (1→2→3→4) while gradually widening the DOF. Thus, the focusing may be improved or optimized to reduce errors.

Having now described exemplary embodiments, those skilled in the art will appreciate that modifications may be made to them without departing from the spirit of the concepts that are embodied in them. Further, it is not intended that the scope of this application be limited to these specific embodiments or to their specific features or benefits. Rather, it is intended that the scope of this application be limited solely to the claims which now follow and to their equivalents.

What is claimed is:

1. An auto focusing method comprising:
   determining a focusing evaluation value;
   comparing the focusing evaluation value with an acceptance level of a preset focusing evaluation value; and
   iteratively focusing, while widening the depth of focus, when the focusing evaluation value is lower than the acceptance level.

2. The auto focusing method of claim 1, wherein the acceptance level is 80 percent of a maximum of the preset focusing evaluation value.

3. The auto focusing method of claim 1, wherein the depth of focus is within a focus margin.

4. The auto focusing method of claim 1, wherein the iterative focusing is performed by a focusing apparatus including:

a focusing part including a scanning electron microscope (SEM);

a control part including a detector, an analog-to-digital converter (A/D converter), and a controller;

an input part for receiving information;

the controller for receiving an output of the input part; and a display part for visually displaying an operation of the controller.

5. An auto focusing method comprising:

focusing a specific point of a wafer;

determining a focusing evaluation value of the focusing and comparing the focusing evaluation value with an acceptance level of a preset focusing evaluation value;

determining the focusing to be "GOOD" when the focusing evaluation value is higher than the acceptance level; and iteratively focusing the specific point, while widening a depth of focus, when the focusing evaluation value is lower than the acceptance level.

6. The auto focusing method of claim 5, wherein the acceptance level is 80 percent of a maximum of a preset focusing evaluation value.

7. The auto focusing method of claim 5, wherein the depth of focus is within a focus margin of the specific point of the wafer.

8. The auto focusing method of claim 5, wherein the iterative focusing of the specific point of the wafer is performed by a focusing apparatus including:

a focusing part including a scanning electron microscope (SEM);

a control part including a detector, an analog-to-digital converter (A/D converter), and a controller;

an input part for receiving information;

the controller for receiving an output of the input part; and a display part for visually displaying an operation of the controller.

9. The auto focusing method of claim 5, wherein iteratively focusing the specific point includes:

determining the focusing evaluation value obtained from the iterative focusing and comparing the focusing evaluation value with the acceptance level;

determining the focusing to be "GOOD" when the focusing evaluation value is higher than the acceptance level; and iteratively focusing the specific point, while widening the depth of focus, when the focusing evaluation value is lower than the acceptance level.

10. The auto focusing method of claim 9, wherein the depth of focus is within a focus margin of the specific point of the wafer.

11. An auto focusing method comprising:

performing alignment focusing for an alignment point of a wafer;

determining an evaluation of the alignment focusing and comparing an alignment focusing evaluation value of the alignment focusing with an acceptance level of a preset alignment focusing evaluation value;

performing measurement focusing for a measurement point of the wafer when the alignment focusing evaluation value is higher than the acceptance level; and iteratively performing an alignment focusing for the alignment point, while widening a depth of focus, when the alignment focusing evaluation value is lower than the acceptance level.

12. The auto focusing method of claim 11, wherein the acceptance level is 80 percent of a maximum of a preset alignment focusing evaluation value.

13. The auto focusing method of claim 11, wherein the depth of focus is within a focus margin of the alignment point of the wafer.

14. The auto focusing method of claim 11, wherein the alignment focusing of the alignment point of a wafer is performed by a focusing apparatus including:

a focusing part including a scanning electron microscope (SEM);

a control part including a detector, an analog-to-digital converter (A/D converter), and a controller;

an input part for receiving information;

the controller for receiving an output of the input part; and a display part for visually displaying an operation of the controller.

15. The auto focusing method of claim 11, wherein the iterative alignment focusing includes:

determining the alignment focusing evaluation value obtained from the iterative alignment focusing and comparing the alignment focusing evaluation value with the acceptance level;

performing the measurement focusing for the measurement point of the wafer when the alignment focusing evaluation value is higher than the acceptance level; and iteratively performing the alignment focusing for the alignment point, while widening the depth of focus, when the alignment focusing evaluation value is lower than the acceptance level.

16. The auto focus method of claim 15, wherein the depth of focus of the alignment focusing is within a focus margin of the alignment point of the wafer.

17. An auto focusing method comprising:

performing first alignment focusing for an alignment point of the wafer;

determining an evaluation value of the first alignment focusing and comparing an alignment focusing evaluation value of the first alignment focusing with an acceptance level of a preset first focusing evaluation value;

performing first measurement focusing for a measurement point of the wafer when the first alignment focusing evaluation value is higher than the acceptance level; and performing second alignment focusing for the alignment point of the wafer with a wider depth of focus than the depth of focus of the first alignment focusing when the first alignment focusing evaluation value is lower than the acceptance value.

18. The auto focusing method of claim 17, wherein the acceptance level is 80 percent of a maximum of the first alignment focusing evaluation value.

19. The auto focusing method of claim 17, wherein the depth of focus of the second alignment focusing is within a focus margin of the first alignment focusing.

20. The auto focusing method of claim 17, wherein first alignment focusing of the alignment point of the wafer is performed by a focusing apparatus including:

a focusing part including a scanning electron microscope (SEM);

a control part including a detector, an analog-to-digital converter (A/D converter), and a controller;

an input part for receiving information;

the controller for receiving an output of the input part a display part for visually displaying an operation of the controller.

21. The auto focusing method of claim 17, wherein the first measurement focusing includes:
   determining the evaluation value of the first measurement focusing and comparing the evaluation value of the first measurement focusing with an acceptance level of a preset first measurement focusing evaluation value;
   addressing another alignment point of the wafer when the first measurement focusing evaluation value is higher than the acceptance level; and
   performing a second measurement focusing with a wider depth of focus than a depth of focus of the first measurement focusing when the first measurement focusing evaluation value is lower than the acceptance level.

22. The auto focusing method of claim 21, wherein the acceptance level is 80 percent of a maximum of the preset first measurement focusing evaluation value.

23. The auto focusing method of claim 17, wherein the second alignment focusing includes:
   determining the second alignment focusing evaluation value and comparing the second alignment focusing evaluation value with the acceptance level;
   performing a first measurement focusing for the measurement point of the wafer when the second alignment focusing evaluation value is higher than the acceptance level; and
   performing third alignment focusing with a wider depth of focus than the depth of focus of the second alignment focusing when the second alignment focusing evaluation value is lower than the acceptance level.

24. The auto focusing method of claim 23, wherein the depth of focus of the third alignment focusing is within a focus margin of the first alignment focusing.

25. An auto focusing apparatus for performing the method of claim 1.

26. An auto focusing apparatus for performing the method of claim 5.

27. An auto focusing apparatus for performing the method of claim 11.

28. An auto focusing apparatus for performing the method of claim 17.

* * * * *